(12) United States Patent
Kwon

(10) Patent No.: US 6,876,584 B2
(45) Date of Patent: Apr. 5, 2005

(54) SEMICONDUCTOR MEMORY DEVICE FOR REDUCING NOISE IN OPERATION OF SENSE AMPLIFIER

(75) Inventor: Ki-Seop Kwon, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 10/623,289

(22) Filed: Jul. 18, 2003

(65) Prior Publication Data

US 2004/0100843 A1 May 27, 2004

(30) Foreign Application Priority Data

Oct. 31, 2002 (KR) .................................. 10-2002-0066915

(51) Int. Cl.[7] .............................................. G11C 11/34
(52) U.S. Cl. .................................. 365/189.01; 365/205
(58) Field of Search ............................. 365/205, 189.01

(56) References Cited

U.S. PATENT DOCUMENTS 5,587,960 A * 12/1996 Ferris ..................... 365/230.03
5,764,572 A * 6/1998 Hammick ................ 365/189.01
6,008,689 A * 12/1999 Au et al. ..................... 327/534

* cited by examiner

Primary Examiner—M. Tran
(74) Attorney, Agent, or Firm—Blakely Sokoloff Taylor & Zafman

(57) ABSTRACT

The present invention provides a semiconductor memory device for reducing operation noise, as a sense amplifier in accordance with the present invention senses and amplifies a supplied data signal of a bit line pair on high speed. For this object, the semiconductor memory device includes a first cell array including a plurality of unit cells to be selected by an address signal; a sense amplifying unit for sensing and amplifying voltage level of a bit line connected to the plurality of the unit cells; a switching unit for connecting or disconnecting the sense amplifying unit to the bit line; and a sense amplifying connection unit for controlling the switching unit for connecting or disconnecting the sense amplifying unit to the first cell array by increasing or decreasing an amount of current throughout the switching unit in response to the address signal.

14 Claims, 13 Drawing Sheets

SEMICONDUCTOR MEMORY DEVICE FOR REDUCING NOISE IN OPERATION OF SENSE AMPLIFIER

FIELD OF THE INVENTION

The present invention relates to a semiconductor memory device; and, more particularly, to a semiconductor memory device for reducing noise of a sense-amplifier that amplifies a data signal supplied to a bit line to outputs the amplified signal.

DESCRIPTION OF RELATED ART

FIG. 1 is a block diagram showing a typical semiconductor memory device.

As shown, a typical semiconductor memory device includes a row address decoder 20 decoding an inputted row address to output a decoded row address; a column address decoder 30 decoding an inputted column address to output a decoded column address; a cell area 100 outputting data selected by outputs from the row address decoder 20 and the column address decoder 30 by possessing a plurality of a cell array 110, 120, 130 and 140, and a output driver 40 outputting the data from the cell area 100 to an exterior part.

Meanwhile, the cell area 100 has a sense amplifier division 150 and 160 for amplifying data outputted from the cell arrays 110, 120, 130 and 140 and outputting it to the output driver 40.

FIG. 2 is a block diagram of the cell area shown in FIG. 1.

As shown, the cell area 100 includes a plurality of cell arrays 110, 130 and 180, each one constructed with a plurality of cells. Herein, the cell has a typical constitution of one capacitor and one transistor. The cell array also has a pair of bit lines BL and /BL supplied with data stored in a selected cell among the cell array, and the first and second sense amplifier divisions 150 and 170 sensing and amplifying the data supplied to the pair bit lines BL and /BL. First and second sense amplifier control blocks 200 and 300 output a first control signal BISH and a second control signal BISL for connecting or disconnecting the first and the second sense amplifier divisions 150 and 170 to cell arrays 110, 130 and 180.

FIG. 3 is a circuit diagram of the first sense amplifier division shown in FIG. 2.

As shown, the first sense amplifier division 150 includes a sense amplifier 152, a pre-charge division 155, a first equalizer 154, a second equalizer 156, and a sense-amplifier output driver 157.

The sense amplifier 152 amplifies a potential gap between bit lines BL and /BL as being enabled by enable signals RTO and /S. The pre-charge division 155 charges the bit lines BL and /BL by using a bit line pre-charge voltage Vblp being enabled by a pre-charge enable signal BLEQ outputted when the sense amplifier 152 is disabled. The first equalizer 154 makes voltage levels of the two bit lines BL and /BL equivalent. Herein, the two bit lines are connected to the cell array 0 110 by a first equalization signal BLEQH. The second equalizer 156 makes also voltage levels of the two bit lines BL and /BL equivalent. Herein, the two bit lines BL and /BL are connected to the cell array 1 130 by a second equalization signal BLEQL. The sense-amplifier output driver 157 outputs data to data lines DB and /DB that data is amplified by the sense amplifier 152 and a column control signal CD created by a column address.

In addition, the sense first amplifier control block 200 outputs a first and a second control signals BISH and BISL for connecting or disconnecting the sense amplifier division 150 to the first cell array and the second cell array 110 and 130. Herein, each capacitor C1 to C4 represents a load capacitance of the bit lines BL and /BL including a unit cell and a metal wire of each first and second cell arrays 110 and 130.

FIG. 4 is an operation waveform of the sense amplifier division shown in FIG. 3. Hereinafter, referring to FIGS. 1 to 4, the operation of the sense amplifier division in the semiconductor memory device is described.

First, a former type of the sense amplifier division senses and amplifies data of a unit cell of the cell arrays, each having a sense-amplifier, when the data are supplied to a bit line. However, the two cell arrays 110 and 130 have one sense amplifier division 150 for achieving a high integration of the semiconductor memory device, and the sense amplifier division 150 is connected or disconnected to the cell arrays 110 and 130 by the proper control signals BISH and BISL.

For instance, the sense amplifier division 150 is connected to the first cell array 110 by a first connection part 151 turned on by the first control signal BISH outputted from the first sense amplifier control block 200, and also connected to the second cell array 130 by a second connection part 153 turned on by the second control signal BISL.

If one of the cell arrays 110, 130 and 180 is connected to the sense amplifier division 150, one of the unit cell is selected by inputted address and the data signal of the selected unit cell is supplied to the pre-charged bit lines BL and /BL– typically, it is pre-charged with a half of supply voltage.

FIG. 4 shows a case that after a high voltage level is supplied to a word line with the first and the second control signals BISH and BISL outputted from the sense amplifier control block 200, the sense amplifier 152 subsequently senses and amplifies data supplied to the bit lines BL and /BL to a supply voltage VDD and a ground VSS.

In an actual semiconductor memory device, a sense amplifier division 150 has a plurality of the sense amplifiers 152 for amplifying data supplied to a plurality of the bit line pairs BL and /BL connected to one of the cell arrays. The number of the sense amplifiers in the bit line are decided by the number of the bit line pairs BL and /BL connected to one of the cell arrays.

FIG. 5 is a schematic circuit diagram showing a sense amplifying connection control block for disconnecting the cell array to the sense amplifier block at predetermined time before the sense amplifier 152 senses and amplifies the signal supplied to the bit line pair.

As shown, the sense amplifying connection control block 200 includes a precharging block 210 for precharging a output node X with the first supply voltage VDD, a connection signal generator 220 for precharging the output node X with the second supply voltage VPP, and a disabling block 230 for supplying the output node X with the ground voltage. The first or the second connection signal BISH or BISL is outputted from the output node X of the sense amplifying connection control block 200.

The first supply voltage VDD unit the supply voltage which can be used for enabling blocks of the typical memory device. The second power voltage VPP is internally used for high speed executions, e.g., overdriving, which needs higher voltage level than the first power voltage VDD. For example, if the first power voltage VDD is about 2.5V, the second power voltage VPP is about 3.3V.

The precharging block 210 includes a second level-shifter 221 and a first PMOS transistor P1. The second level-shifter 221 receives a converted signal of a first control signal Blk_com and outputs the first supply voltage VDD for turning the first PMOS transistor P1 on. Drain of the first PMOS transistor P1 is connected to the first supply voltage VDD and source of the first PMOS transistor P1 is coupled to the node X. Thus, if the first PMOS transistor P1 is turned on, the node X is precharged with the first supply voltage VDD.

The connection signal generating block 220 includes a first NOR gate NR1, a first NAND gate ND1, a second level-shifter 211, and a second PMOS transistor P2. The NOR gate NR1 receives a converted signal of a second control signal Blk_next and a third control signal Bis_off. The second control signal Blk_next is used for connecting the sense amplifying block 150 to the neighbor second cell array 130. The third control signal Bis_off is used for transiently disconnecting the sense amplifying block 150 to the cell arrays 110 and 130. The first NAND gate ND1 receives an output signal of the NOR gate NR1 and a forth control signal Blk_self. The forth control signal Blk_self is used for connecting the sense amplifying block 150 to the first cell array 110. The second level-shifter 221 receives an output signal of the first NAND gate ND1 and outputs the second supply voltage VPP for turning on the second PMOS transistor P2. Drain of the second PMOS transistor P2 is connected to the second supply voltage VPP and source of the second PMOS transistor P2 is coupled to the node X. Thus, if the second PMOS transistor P2 is turned on, the node X is precharged with the second supply voltage VPP.

The connection signal disable block 230 includes a second NAND gate ND2 and a first NMOS transistor N1. The second NAND gate ND2 receives the converted signal of the second control signal Blk_next and the third control signal Bis_off. Gate of the first NMOS transistor N1 receives an output signal of the second NAND gate ND2 and source of the first NMOS transistor N1 is connected to the ground voltage VSS. Drain of the first NMOS transistor N1 is coupled to the node X. Thus, if the first NMOS transistor N1 is turned on, the node X is supplied with the ground voltage VSS, i.e., the first and the second connection signals BISH and BISL are disabled.

FIG. 6 is a schematic circuit diagram showing the second level-shifter shown in FIG. 5.

As shown, if drains of two MOS transistors P3 and P4 is connected to the second supply voltage VPP, the level-shifter outputs the second supply voltage VPP or the ground voltage VSS into a output terminal OUT in response to the inputted signal of an input terminal IN.

FIG. 7 is a waveform showing operation of the sense amplifying connection control block 200 shown in FIG. 5, and FIG. 8 is a waveform showing operation of the sense amplifying block 150 shown in FIG. 3.

Hereinafter, referring to FIG. 3 to FIG. 8, it is described in detail that the sense amplifier amplifies the data signal supplied to the bit line after the sense amplifier block 150 is transiently disconnected to the cell array for reducing the loading capacitor.

As shown in FIG. 7, if any address is not inputted, the sense amplifier block 150 is disconnected to the cell arrays 110 and 130. For disconnecting the sense amplifier block 150 to the cell arrays 110 and 130, the control signal Blk_com is in logic high 'H' and the control signals Blk_self and Blk_next are in logic low 'L' so that the MOS transistors P2 and N1 are turned off and the first PMOS transistor P1 is turned on. Then, the output node X is precharged with the first power voltage VDD. Herein, there can be occurred the precharging operation for quickly connecting and disconnecting the cell array 110 or 130 to the sense amplifier block 150.

After the address is inputted in the memory device, the control signal Blk_com is inputted in logic low 'L' and the control signals Blk_self and Blk_next are inputted in logic high 'H' so that the MOS transistors P1 and N1 are turned off and the PMOS transistor P2 is turned on. Then, the cell array 110 is connected to the sense amplifier block 150.

If the first connection signal BISH is supplied with the second voltage level, the sense amplifier block 150 is connected to the first cell array 110. As a result, the second sense amplifier connection control block 200 supplies the second connection signal BISL with the logic low 'L' so that the sense amplifier block 150 is disconnected to the second cell array 130.

Herein, the first to the forth control signals Blk_com, Blk_next, Blk_self and Blk_off are inputted for controlling the sense amplifier connection control block 200 and are generated from the address signals. The first control signal Blk_com is used for selecting two cell arrays near the sense amplifier block 150. The second control signal Blk_next is used for changing the cell array which is presently connected to the sense amplifier block 150 into the other. The third control signal Bis_off is used for temporary disconnecting the sense amplifier block 150 to the present connected cell array. The forth control signal Blk_self shows what cell array is now connected to the sense amplifier block 150.

Continuously, after the first cell array 110 is connected to the sense amplifier block 150, one word line WL of the first cell array 110 is selected and, then the data signal is outputted to the bit line pair BL and /BL.

If the enable signal of the sense amplifier 152 is inputted, the sense amplifier 152 amplifies the supplied signal of the bit line pair. For temporary disconnecting the sense amplifier to the first and second cell arrays 110 and 130 during amplifying operation of the sense amplifier, the third control signal Bis_off inputted to the sense amplifier connection control block 200 is in logic high 'H' as shown in FIG. 7.

In the section that the third control signal Bis_off is in logic level 'H', the NMOS transistor N1 in the sense amplifier connection control block 200 is turned off and the PMOS transistors P1 and P2 are also turned off so that the first connection signal BISH is transiently outputted in logic level 'L'. Thus, if the first switching block 151 is turned off, the sense amplifier block 150 is temporary connected to the first cell array 110.

Thus, because of disconnecting the first cell array 110 to the sense amplifier block 150 when the sense amplifier 152 is operated, the large loading capacitance which is generated by the first cell array 110 is reduced. Thus, the sense amplifier can amplify the signal of the bit line pair BL and /BL as soon as possible. After the sense amplifier 152 amplifies the signal of the bit line pair BL and /BL, the first connection signal BISH is in logic high 'H' for connecting the sense amplifier block 150 to the first cell array 110 and the amplified data signal is outputted to the data line DB and /DB through a sense amplifier output unit 157.

As shown in FIG. 8, the BLA and /BLA curves show voltage variation of the bit line pair of a conventional sense amplifier (not shown) and the BL and /BL curves show voltage variation of the bit line pair of another conventional sense amplifier shown in FIG. 3. The present sense amplifier shown in FIG. 3 amplifies more quickly than that of the above first sense amplifier when the first connection signal BISH transiently disconnects the sense amplifier block 150 to the cell array 110. Eventually, operation of the memory device becomes faster and a delay value tRCD is dramatically improved. The delay value tRCD unit time gap between decoding a row address and decoding a column address.

However, voltage level of the bit line pair BL and /BL is swayed at moment that the first connection signal BISH is in logic high 'H', i.e., the first cell array 110 is reconnected to the sense amplifier block 150. This reason is because a remaining charge of the sense amplifier block 150 is flowed into the bit line pair BL and /BL of the first cell array 110 at the moment that the first cell array 110 is reconnected to the sense amplifier block 150.

Therefore, the memory device is transiently unstable at the moment. The larger the voltage variation of the bit line pair BL and /BL, the higher error probability in a case that the data of the bit line is outputted to the data bus pair DB and /DB by the column control signal CD. Namely, reliability of the read operation is dramatically decreased.

Even though there is no error, a delay time is generated when the data signal is outputted to the data bus pair DB and /DB. If there is the delay time, it is useless that the cell array 110 or 130 is transiently disconnected to the sense amplifier block 150. Also, a noise is occurred by swaying voltage level of the bit line. As a result, reliability of operation of the semiconductor memory device is decreased because of the noise.

SUMMARY OF INVENTION

It is, therefore, an object of the present invention to provide a semiconductor memory device for reducing a noise of a sense amplifier which amplifies a data signal of a bit line pair to thereby increase reliability of operation.

In accordance with an aspect of the present invention, there is provided the semiconductor memory device includes a plurality of unit cells to be selected by an address signal; a sense amplifying unit for sensing and amplifying voltage level of a bit line connected to the plurality of the unit cells; a switching unit for connecting or disconnecting the sense amplifying unit to the bit line; and a sense amplifying connection unit for controlling the switching unit for connecting or disconnecting the sense amplifying unit to the first cell array by increasing or decreasing an amount of current throughout the switching unit in response to the address signal.

In accordance with other aspect of the present invention, there is provided a method for executing a semiconductor memory device having a cell array including a plurality of unit cells, a sense amplifier for sensing and amplifying voltage level of a bit line connected to the plurality of the unit cells, and a switching transistor for connecting or disconnecting the sense amplifying unit to the bit line, includes the step of connecting the cell array to the sense amplifier by turning the switching transistor off, the step of supplying voltage level of a data signal stored in the unit cell of the cell array, the step of disconnecting the bit line to the sense amplifier by turning the switching transistor off, the step that the sense amplifying unit senses and amplifies voltage of the bit line; the step E of flowing the a first current to the switching transistor by supplying a first voltage to gate of the switching transistor, and the step of reconnecting the cell array to the sense amplifying unit by flowing a second current throughout the switching transistor after supplying a second voltage being higher than the first voltage to gate of the switching transistor.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a semiconductor memory device according to the present invention will be described in detail referring to the accompanying drawings.

Figure 1:
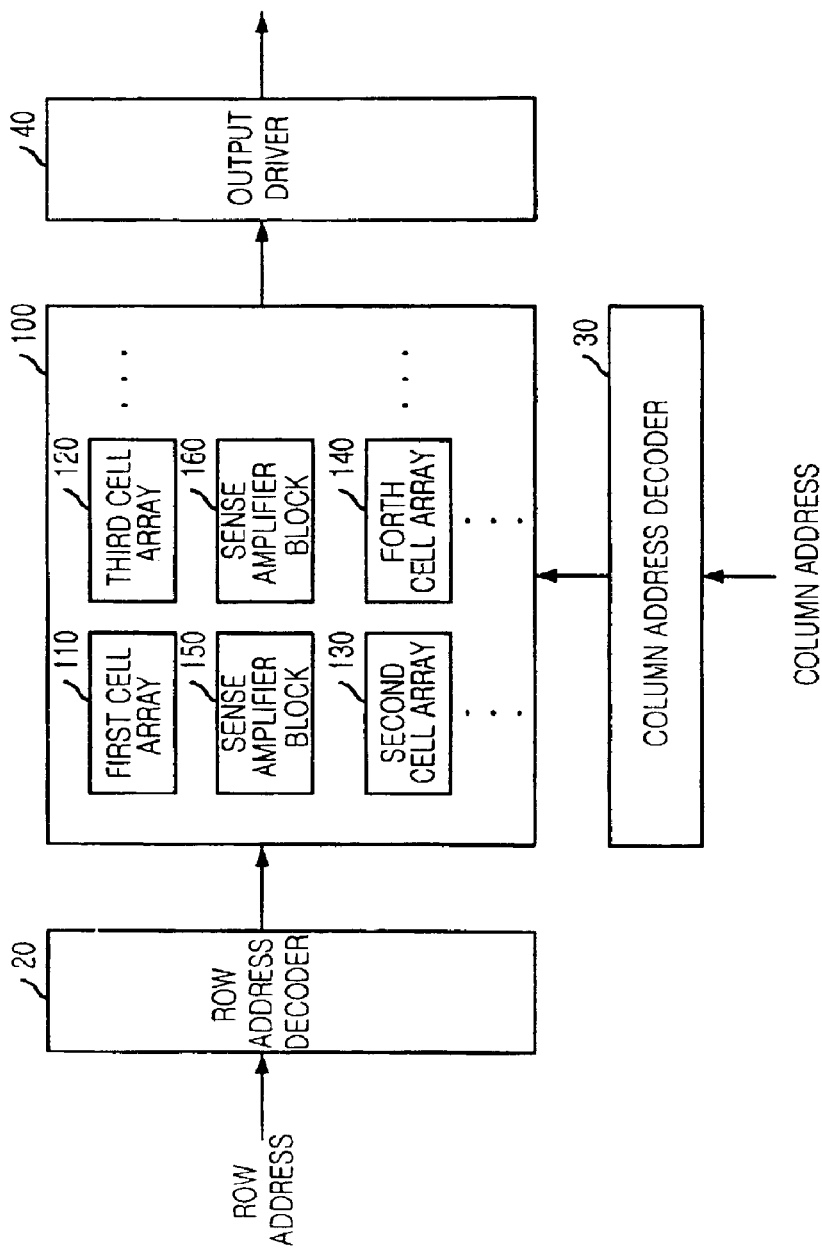
FIG. 1 is a block diagram showing a typical semiconductor memory device.
Figure 2:
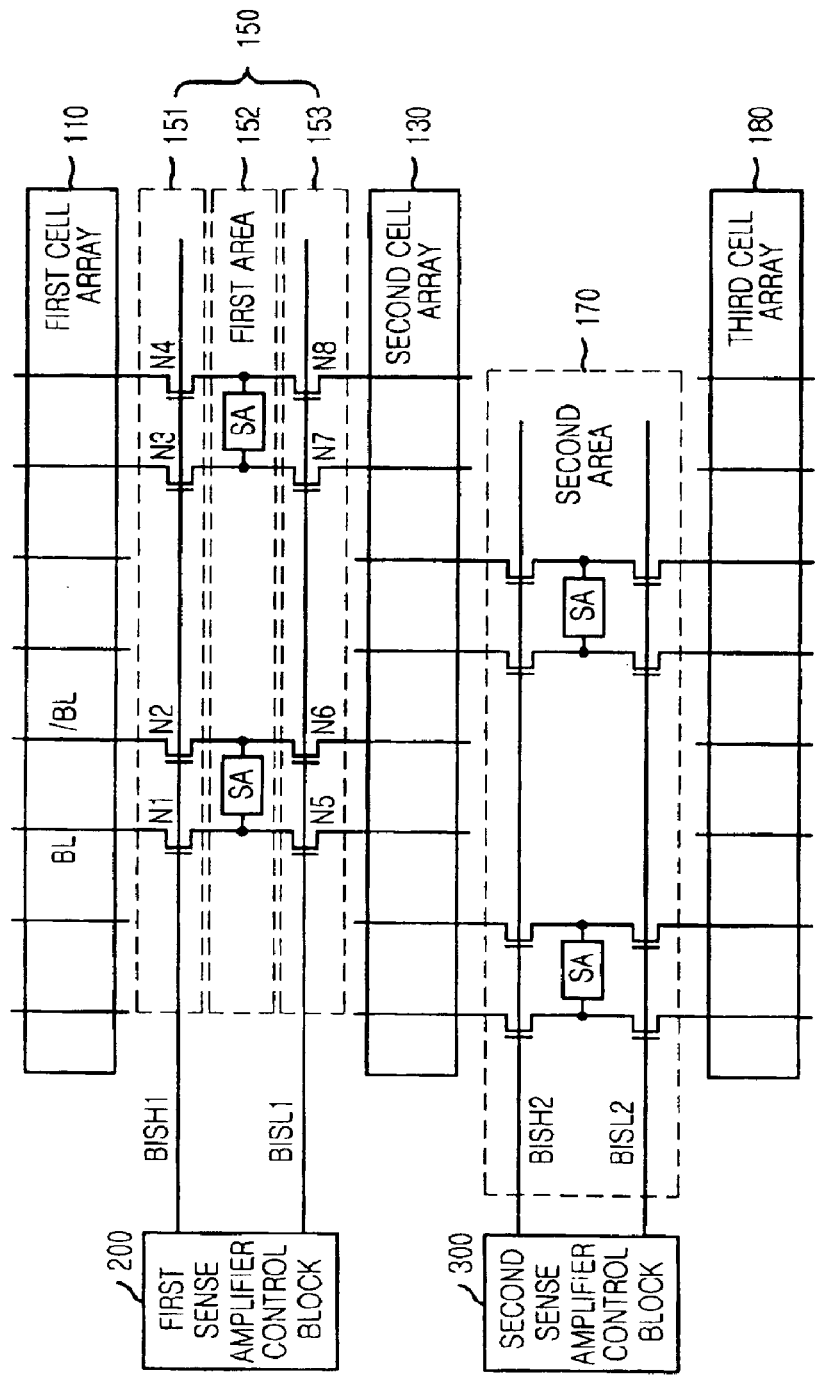
FIG. 2 is a block diagram of the cell area shown in FIG. 1.
Figure 3:
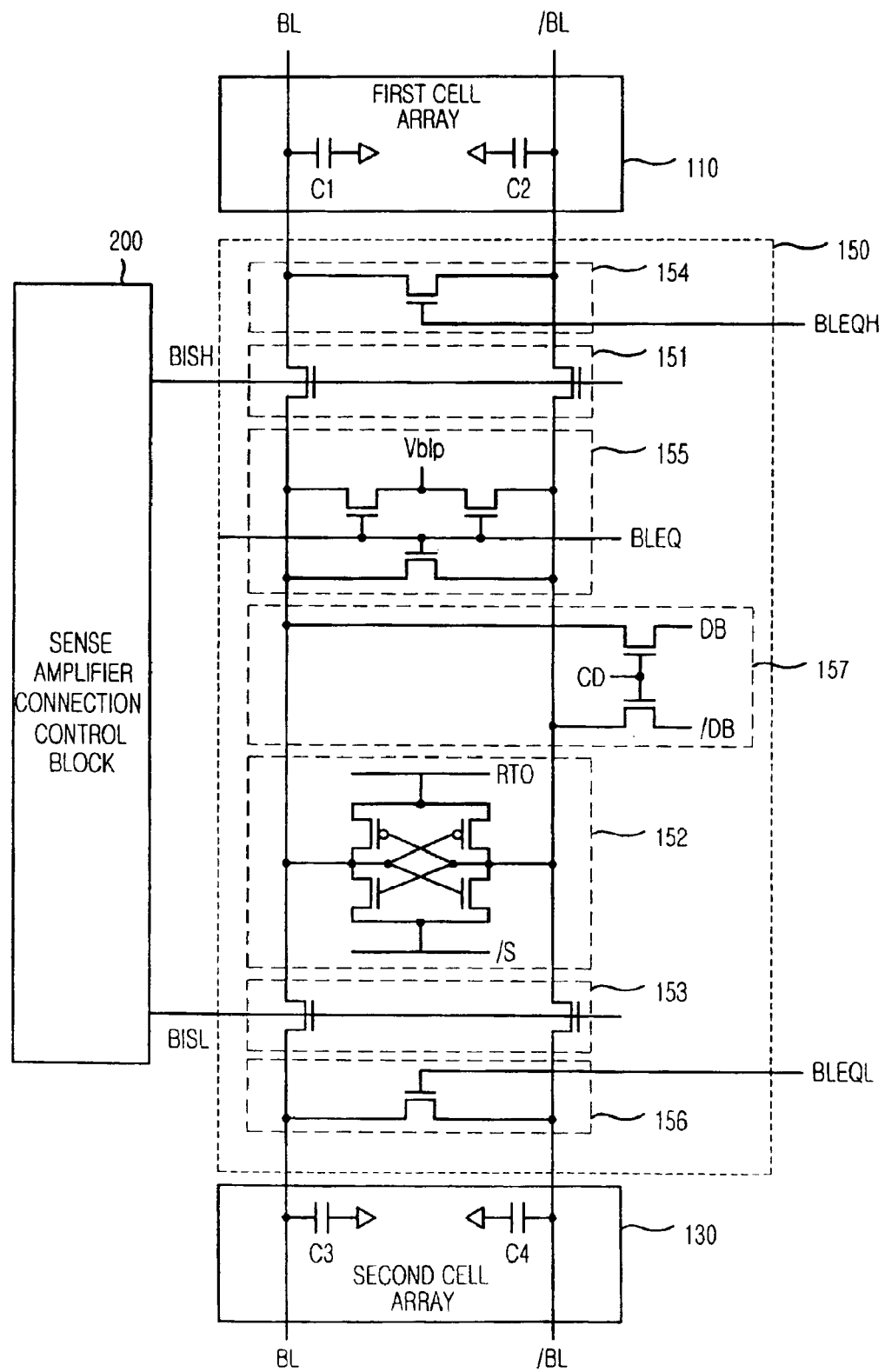
FIG. 3 is a circuit diagram of the first sense amplifier division shown in FIG. 2.
Figure 4:
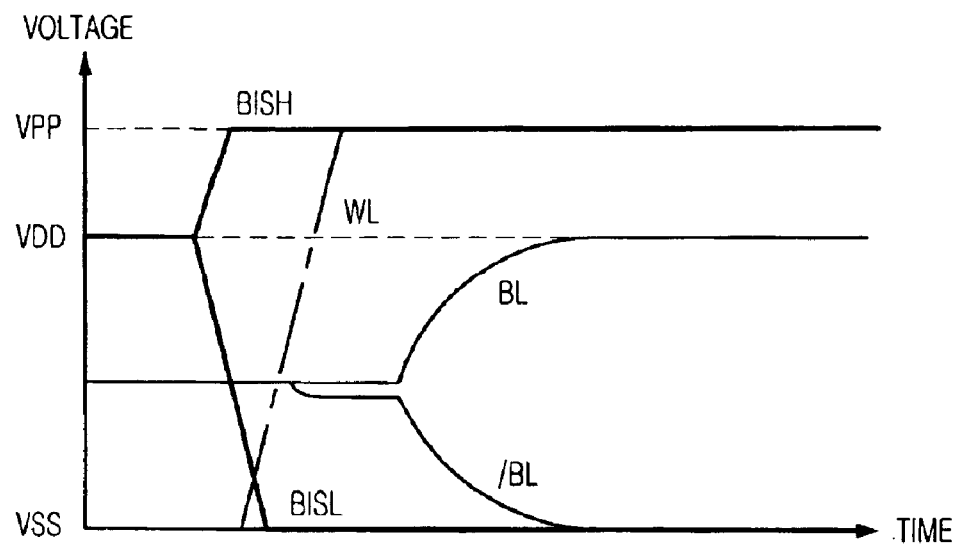
FIG. 4 is an operation waveform of the sense amplifier division shown in FIG. 3.
Figure 5:
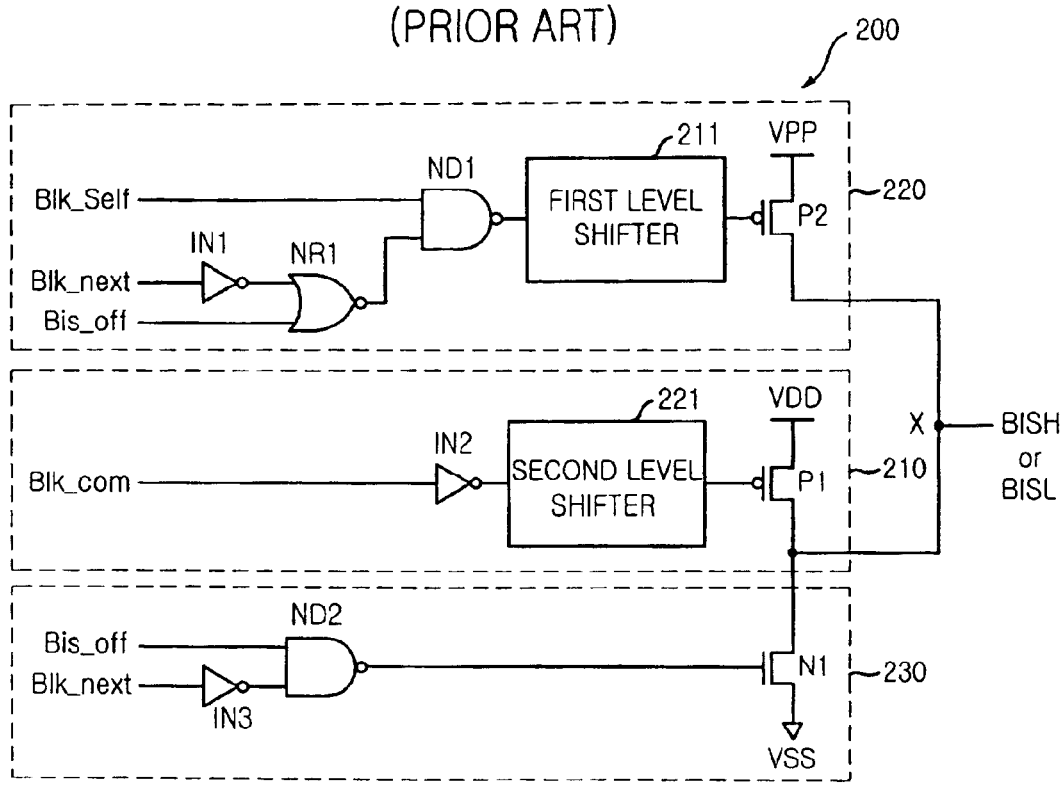
FIG. 5 is a schematic circuit diagram showing a sense amplifying connection control block shown in FIG. 3.
Figure 6:
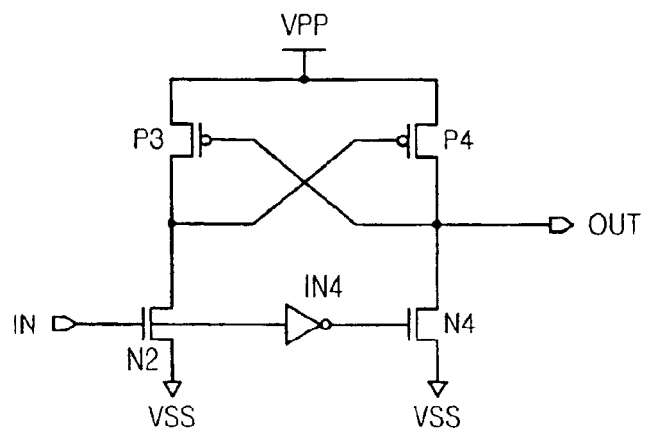
FIG. 6 is a schematic circuit diagram showing the second level-shifter shown in FIG. 5.
Figure 7:
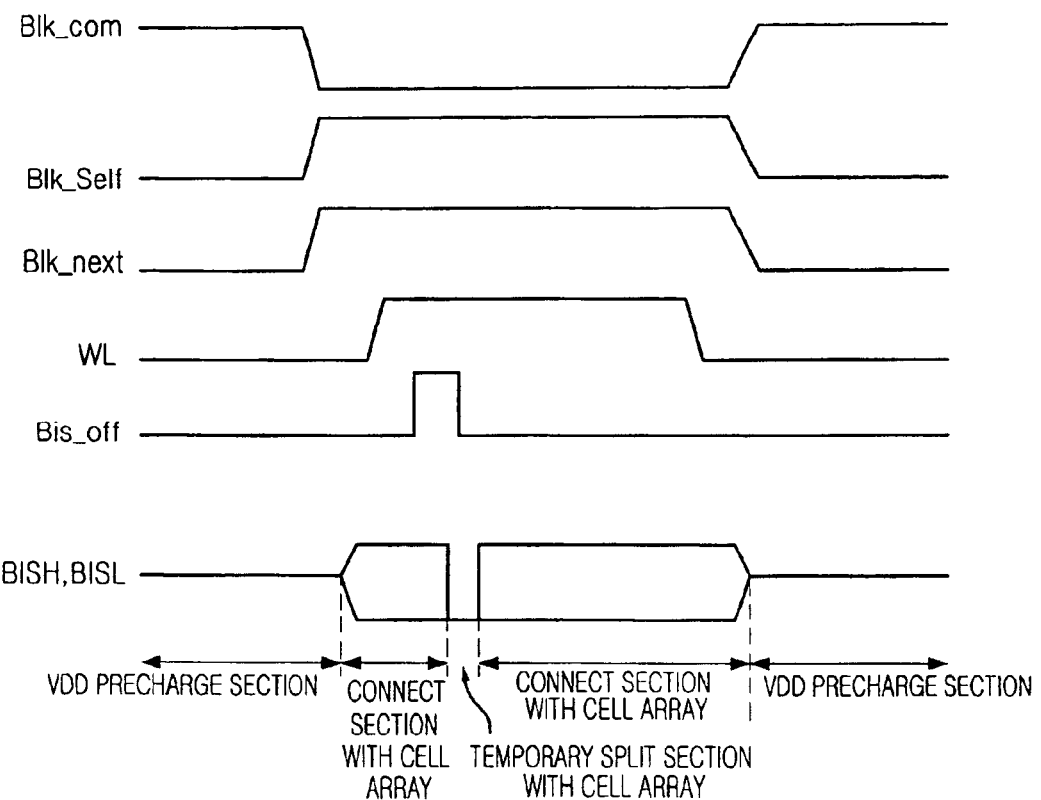
FIG. 7 is a waveform showing operation of the sense amplifying connection control block 200 shown in FIG. 5.
Figure 8:
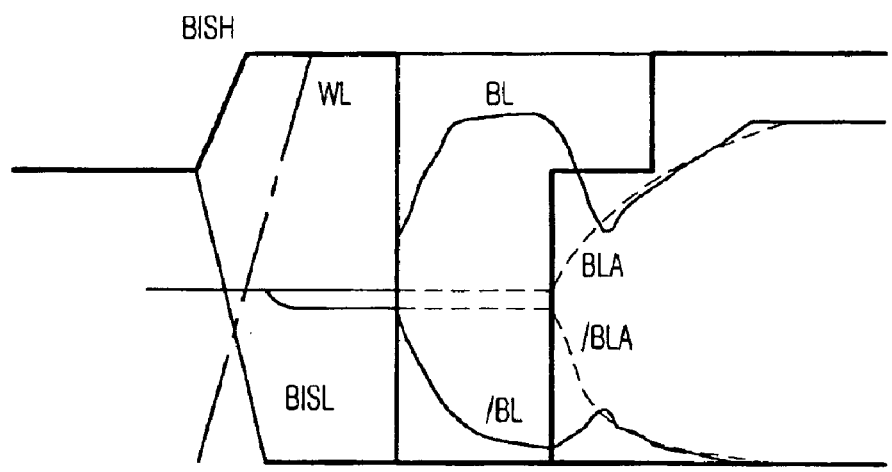
FIG. 8 is a waveform showing operation of the sense amplifying block 150 shown in FIG. 3.
Figure 9:
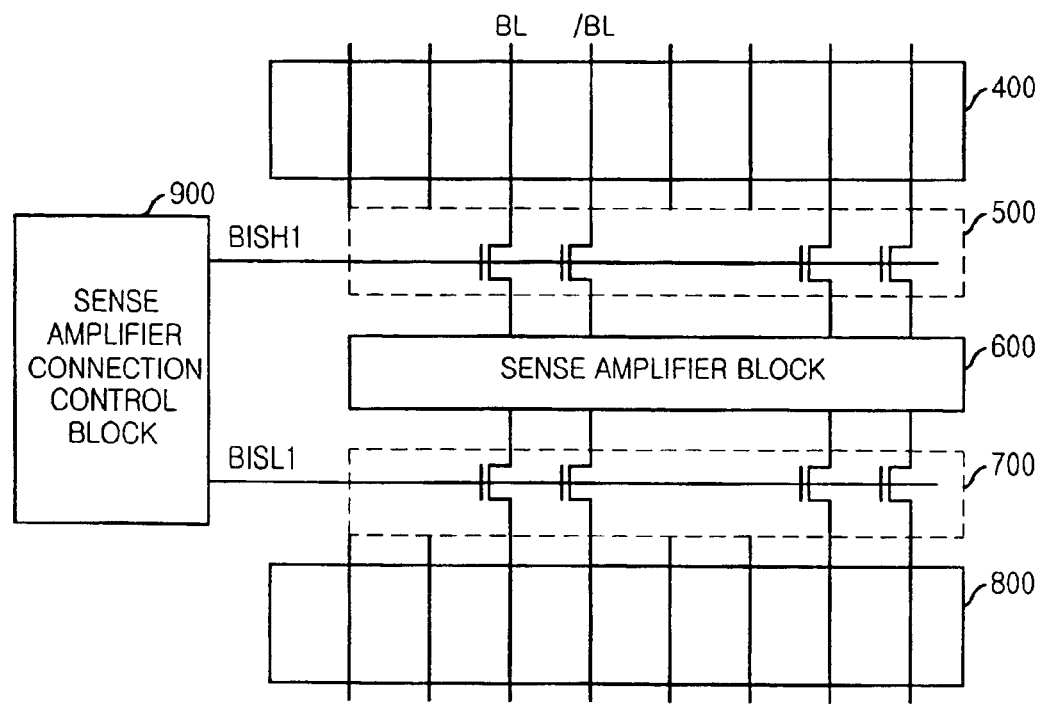
FIG. 9 is a block diagram showing a semiconductor memory device in accordance with a preferred embodiment of the present invention.

FIG. 9 is a block diagram showing the semiconductor memory device in accordance with a preferred embodiment of the present invention.

As shown, the semiconductor memory device in accordance with the preferred embodiment includes a first and a second cell arrays 400 and 800, a sense amplifier block 600, a first and a second switching units 500 and 700, and a sense amplifying connection control block 900.

Each of the first and the second cell arrays 400 and 800 includes a plurality of unit cells. The first and the second switching units 500 and 700 selectively connect or disconnect the sense amplifier block 600 to the first and the second cell arrays 400 and 800. The first and the second switching units 500 and 700 are composed of a plurality of MOS transistors. The sense amplifier block 600 amplifies a signal of a bit line connected to the plurality of the unit cells. The sense amplifying connection control block 900 outputs a first and a second connection signal BISH and BISL for connecting or disconnecting the sense amplifier block 600 to the first or the second cell array 400 or 800.

Figure 10:
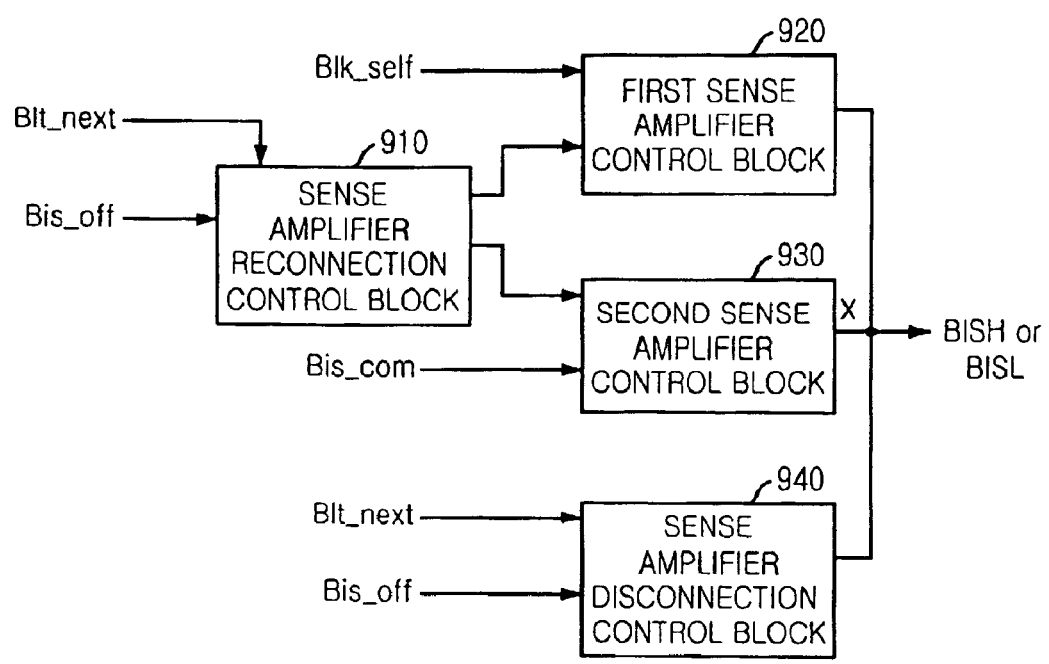
FIG. 10 is a block diagram of a sense amplifying connection control block shown in FIG. 9.

FIG. 10 is a block diagram showing the sense amplifying connection control block 900 shown in FIG. 9. The sense amplifying connection control block 900 outputs the first connection signal BISH and the second connection signal BISL.

As shown, the sense amplifying connection control block 900 includes a first sense amplifier control unit 920, a second sense amplifier control unit 930, a sense amplifier reconnection control unit 910 and a sense amplifier disconnection control unit 940.

The first sense amplifier control unit 920 outputs a first current to the switching unit 500 for connecting the first cell array 400 to the sense amplifier block 600. The sense amplifying disconnection control block 940 turns the switching unit 500 off until the sense amplifying unit 600 amplifies a data signal of the bit line pair BL and /BL. The second sense amplifier control unit 930 outputs a second current to the switching unit 500 when the first cell array 400 is not selected. Amount of the second current is lesser than that of the first current. The sense amplifier reconnection control block 910 controls the first sense amplifier control logic 920 and the second sense amplifier control logic 930.

Figure 11:
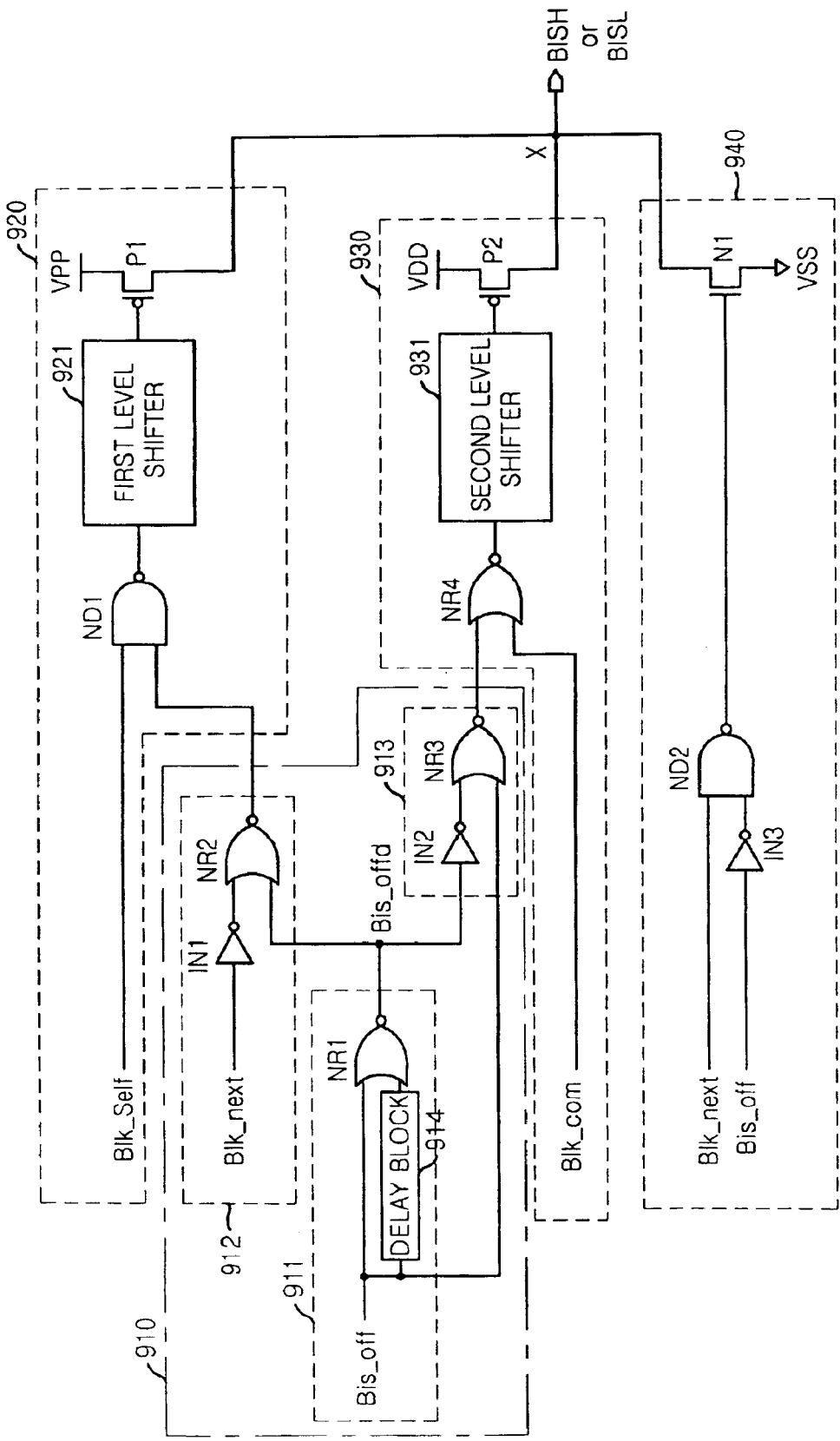
FIG. 11 is a schematic circuit diagram of the sense amplifying connection control block shown in FIG. 9 in accordance with a preferred embodiment of the present invention.

FIG. 11 is a schematic circuit diagram showing the sense amplifying connection control block 900 shown in FIG. 9 in accordance with the preferred embodiment of the present invention.

As shown, the senses amplifying reconnection block 910 include a disconnection signal generating block 911, a first reconnection control block 912 and a second reconnection control block 913.

The disconnection signal generating block 911 delays a first disconnection signal Bis_off and outputs a second disconnection signal Bis_offd. The second disconnection signal Bis_offd has a longer logical high section than the first disconnection signal Bis_off does. The disconnection signal generating block 911 has a delay block 914 for lengthening the logical high section of the first reconnection signal Bis_off and a first NOR gate NR1 for receiving the first disconnection signal Bis_off and an output signal of the delay block 914.

The first reconnection control block 912 disables the first sense amplifier control unit 920 if the second disconnection signal Bis_offd is in logical high. The first reconnection control block 912 includes a first inverter IN1 for inversing a first control signal Blk_next and a second NOR gate NR2 for receiving the second disconnection signal Bis_offd and an output signal of the first inverter IN1. The first control signal Blk_next is used to connect the second cell array 800 to the sense amplifier block 600.

The second reconnection control block 913 enables the second sense amplifier control block 930 during a timing gap between logical high sections of the first disconnection signal Bis_off and the second disconnection signal Bis_offd. The second reconnection control block 913 includes a second inverter IN2 and a third NOR gate NOR3. The second inverter IN2 inverses the second disconnection signal Bis_offd. The third NOR gate NOR3 receives the first disconnection signal Bis_off and output of the second inverter IN2 and, then controls the second sense amplifier control block 930.

The first sense amplifying connection control block 920 includes a first NAND gate ND1, a first level shifter and a first PMOS transistor. The first NAND gate ND1 receives a second control signal Blk_self and an output signal of the first reconnection control block 912. The second control signal Blk_self is used to connect the first cell array 400 to the sense amplifier block 600. The first level-shifter 921 receives an output signal of the first NAND gate ND1 and outputs the first supply voltage VPP for turning on the first PMOS transistor P1. The first PMOS transistor P1 outputs the first supply voltage VPP to the switching unit 500.

The second sense amplifying connection control block 930 includes a forth NOR gate NR4, a second level shifter and a second PMOS transistor P2. The forth NOR gate NR4 receives an output signal of the second reconnection control block 913 and a third control signal Blk_com. The third control signal Blk_com is used for connecting the first and the second cell arrays 400 and 800 to the sense amplifier block 600. The second level shifter 921 receives an output signal of the forth NOR gate NR4 and outputs the second supply voltage VDD for turning on the second PMOS transistor P2. The second PMOS transistor P2 outputs the second supply voltage VDD to the switching unit 500.

The sense amplifying disconnection control block 940 includes a third inverter IN3, a second NAND gate ND2 and a first NMOS transistor N1. The third inverter IN3 outputs an inverted signal of the first disconnection signal Bis_off to the second NAND gate ND2. The second NAND gate ND2 receives the first control signal Blk_next and the inverted signal of the first disconnection signal Bis_off. The NMOS transistor N1 delivers the ground voltage VSS to the switching unit 500 for disconnecting the sense amplifier block 600 to the first and the second cell arrays 400 and 800.

Figure 12:
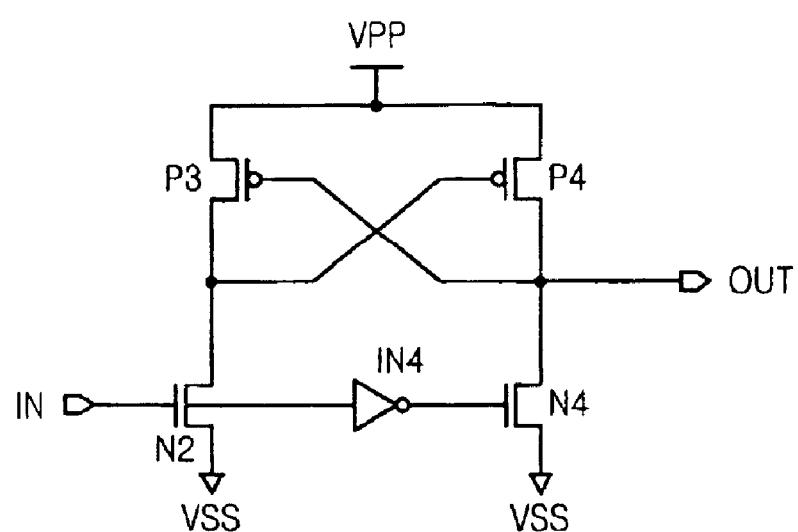
FIG. 12 is a schematic circuit diagram of a level shifter shown in FIG. 10.

FIG. 12 is a schematic circuit diagram showing the first level shifter 921 shown in FIG. 11.

As shown, if drains of two MOS transistors P3 and P4 is connected to the second supply voltage VPP, the first level shifter outputs the second supply voltage VPP or the ground voltage VSS into a output terminal OUT in response to the inputted signal of an input terminal IN. The first level shifter 921 includes a third and a forth PMOS transistors P3 and P4, a second and a forth NMOS transistor N2 and N4 and a forth inverter IN4. Gate of the second NMOS transistor receives an input signal IN and gate of the forth NMOS transistor receives the inverted input signal /IN. Sources of the second and the third NMOS transistors N2 and N3 are individually coupled to ground voltage VSS. Drains of the second and the third NMOS transistors N2 and N3 is connected to sources of the first and the second PMOS transistors P3 and P4. The drain of each PMOS transistor is connected to the first voltage VPP. The gate of each PMOS transistor is cross-coupled to the source of each PMOS transistor.

Figure 13:
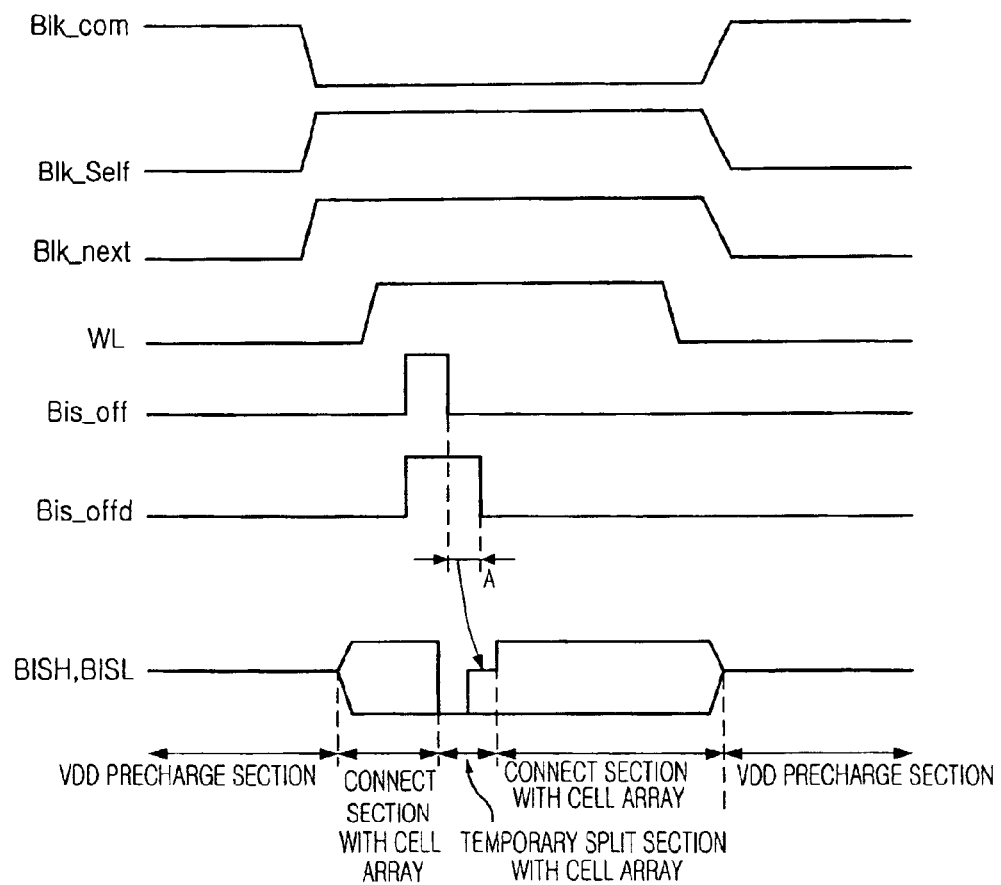
FIG. 13 is an timing diagram waveform of a sense amplifying connection control block shown in FIG. 11.
Figure 14:
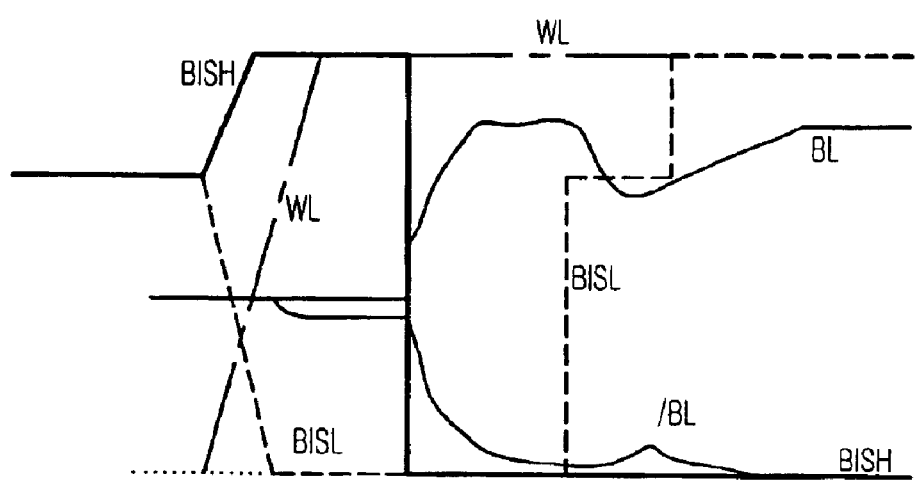
FIG. 14 is an operation waveform of a sense amplifying unit shown in FIG. 9.

FIG. 13 is a timing diagram showing the sense amplifying connection control block 900 shown in FIG. 11, and FIG. 14 is an operation waveform showing the sense amplifier block 600 shown in FIG. 9. Hereinafter, referring to FIG. 9 to FIG. 14, there is described operation of the memory device in accordance with the present invention in detail.

If any address is not inputted, the sense amplifier block 600 is not connected to the first or the second cell array 400 or 800. Then, the third control signal Blk_com is in logical high 'H' and the first and the second control signals Blk_next and Blk_self are in logical low 'L' so that the second PMOS transistor P2 and the first NMOS transistor N1 are turned off and the PMOS transistor P1 is turned on. As a result, the output node X is precharged with the first voltage VDD. This precharging operation is needed for connecting or disconnecting the cell array to the sense amplifier block more quickly.

In the precharging operation, if the gate of MOS transistors in the switching unit 500 or 700 is supplied with the first voltage VDD, i.e., any address is not inputted, any unit cell of the cell array is not selected. So, there is no current flowing from the bit line pair of the cell array to the sense amplifier block.

If an address is inputted to the cell array, the third control signal Blk_com is in logical level 'L' and the first and the second control signals Blk_next and Blk_self are in logical level 'H' so that the first PMOS and NMOS transistors P1 and N1 are turned off and the second PMOS transistor P2 is turned on. As a result, the cell array 400 is connected to the sense amplifier block 600. Namely, if the first connection signal BISH is the same to the second voltage VPP, the switching unit 500 is turned on and, then the sense amplifier block 600 is connected to the first cell array 400. Coincidently, the second connection signal BISL which is outputted from the sense amplifier connection control block 900 is in logical low 'L' so that the switching unit 700 is turned off. As a result, the sense amplifier block 600 is disconnected to the second cell array 800.

Herein, the first to the third control signals Blk_next, Blk_self and Blk_com are signals which are inputted for controlling the sense amplifier connection control block 900 and made from an inputted address signal. The second control signal Blk_self is used for connecting the sense amplifier block 600 to the cell array, e.g., 400. The first control signal Blk_next is used for connecting the sense amplifier block 600 to the other cell array, e.g., 800. The third control signal Blk_com connects two cell arrays 400 and 800 to the sense amplifier block 600. The first disconnection signal Bis_off temporary disconnects the sense amplifier block 600 to the first and the second cell arrays 400 and 800.

Continuously referring to operation of the sense amplifier connection control block 900, if one word line WL of the first cell array 110 is selected, the stored data of the unit cells in response to the selected word line are supplied to the bit line pair BL and /BL. The sense amplifier block 600 amplifies the data of the bit line pair BL and /BL. Then, the first disconnection signal Bis_off is inputted to the sense amplifier connection block 900 so that the first and second cell arrays 400 and 800 are transiently disconnected to the sense amplifier block 600 during an amplifying operation of the sense amplifier block 600.

In a section that the first disconnection signal Bis_off is in logical high 'H', the first NMOS transistor N1 is temporary turned off and the first and the second PMOS transistors P1 and P2 are turned off. As a result, the first connection signal BISH is transiently supplied with logical low 'L' for disconnecting the sense amplifier block 600 to the first cell array 400.

Likewise, during the operation that the sense amplifier 600 senses and amplifies the supplied data signal of the bit line pair BL and /BL, the cell array is temporary disconnected to the sense amplifier block 600 so that the large loading capacitance occurred from connection between the cell array 400 or 600 and the sense amplifier block 600 is reduced and the sense amplifier block 600 can be generated more quickly on high speed.

Then, the disconnection signal generating block 911 receives the first disconnection signal Bis_off to generate the second disconnection signal Bis_offd. The first reconnection control block 912 converses the second connection signal Bis_offd for outputting the first sense amplifier connection block 920. As a result, in the first sense amplifier connection block 920, the first PMOS transistor P1 is turned off during the logical high section of the second disconnection signal Bis_offd.

In the mean time, the second reconnection control block 913 outputs a logical high signal to the second sense amplifier connection block 930 for turning on the second PMOS transistor P2. As a result, the second supply voltage VDD is outputted to the switching unit 500. In contrast, if the first reconnection control block 912 outputs a logical low signal to the first sense amplifier connection block 920, the second PMOS transistor P2 of the second sense amplifier block 930 is turned off and the first PMOS transistor P1 of the first sense amplifier connection block 920 is turned on so that the first supply voltage VPP is outputted to the switching unit 500.

Namely, gates of the MOS transistors in the switching unit 500 are initially supplied with the second supply voltage VDD. For connecting the sense amplifier logic 600 to the first cell array 400, the first supply voltage VPP is supplied to the gate of the MOS transistor in the switching unit.

Continuously, the data signal amplified by the sense amplifier block is outputted to the exterior circuit of the memory device through the data line pair DB and /DB.

Herein, the first level shifter 921 of the first sense amplifier connection control block 920 boosts output of the first NAND gate ND1 from the second voltage level VDD to the second voltage level VPP. The second level shifter 931 of the second sense amplifier connection block 930 supplies the second voltage level VDD to the output node X.

In FIG. 14, like above statement, if current amount flowed to the switching unit 500 which connects the cell array to the sense amplifier block is controlled in several steps, voltage sway of the bit line pair can be reduced because of the stable operation of the sense amplifier. Namely, the operation noise is dramatically reduced by gradationally controlling the current amount flowing through the switching unit which connects the cell array to the sense amplifier block.

As described above, after the sense amplifier block is connected to the cell array, the sense amplifier block is disconnected to the cell array so that the supplied signal of the bit line pair is amplified. Then there is gradationally increased the current amount flowed through the switching unit at reconnection timing. In addition, the operation noise of the sense amplifier block can be reduced if the current amount flowed through the switching unit is gradationally controlled.

While the present invention has been descried with respect to the particular embodiments, it will be apparent to those skilled in the art that various changes and modification may be made without departing from the spirit and scope of the invention as defined in the following claims.

What is claimed is:

1. A semiconductor memory device, comprising:
   a first cell array including a plurality of unit cells to be selected by an address signal;
   a sense amplifying unit for sensing and amplifying voltage level of a bit line connected to the plurality of the unit cells;
   a switching unit for connecting or disconnecting the sense amplifying unit to the bit line; and
   a sense amplifying connection unit for controlling the switching unit for connecting or disconnecting the sense amplifying unit to the first cell array by increasing or decreasing an amount of current throughout the switching unit in response to the address signal;
   wherein the sense amplifying connection unit temporarily disconnects the sense amplifying unit to the first cell array for the sensing and the amplifying voltage level and reconnects the sense amplifying unit to the first cell array by stepwise increasing the amount of current.

2. The semiconductor memory device as recited in claim 1, wherein the sense amplifying connection unit includes:
- a first sense amplifying connect control block for controlling a first amount of the current throughout the switching unit, when the first cell array is selected;
- a sense amplifying disconnect control block for turning the switching unit off since voltage level of the unit cell is supplied to the bit line until the sense amplifying unit amplifies voltage level of the bit line;
- a second sense amplifying connect control block for controlling a second current capability, which is less than the first amount of amount of the current, throughout the switching unit when the first cell array is not selected; and
- a sense amplifying reconnect control block for controlling the second sense amplifying connect block for flowing the second amount of the current throughout the switching unit; and controlling the first amount of the sense amplifying connect block for flowing the first amount of the current throughout the switching unit, after the sense amplifying unit finishes to amplify voltage level of the bit line.

3. The semiconductor memory device as recited in claim 2, wherein the sense amplifying reconnect block includes:
- a disconnect signal generating block for outputting a second disconnect signal having more long pulsing time than a first disconnect signal after receiving the first disconnect signal for transiently disconnecting the first cell array to the sense amplifying unit;
- a first reconnect control block for disabling the first sense amplifying connect block for inputting the second disconnect signal; and
- a second reconnect control block for enabling the second sense amplifying connect block for time gap between pulse sections of the first disconnect signal and the second disconnect signal.

4. The semiconductor memory device as recited in claim 3, wherein the disconnect signal generating block includes:
- a delay block for delay block for time gap between pulse sections of the first disconnect signal and the second disconnect signal; and
- a first NOR gate for outputting the second disconnect signal after receiving the first disconnect signal at one terminal and a output of the delay block at the other terminal.

5. The semiconductor memory device as recited in claim 4, wherein the first reconnect control block includes:
- a first inverter for inversing a signal selecting a second cell array included in the other side of the sense amplifying unit; and
- a second NOR gate for outputting a signal disabling the first sense amplifying connect control block after receiving the second disconnect signal at one terminal and the first inverter at the other terminal.

6. The semiconductor memory device as recited in claim 5, wherein the second reconnect control block includes:
- a second inverter for receiving, inversing, and outputting the second disconnect signal; and
- a third NOR gate for outputting a signal enabling the second sense amplifying connect block after receiving the first disconnect signal at one terminal and output of the second inverter at the other terminal.

7. The semiconductor memory device as recited in claim 6, wherein the first sense amplifying connect control block includes:
- a first NAND gate for receiving output of the second NOR gate at one terminal and a signal for selecting the first cell array at the other terminal; and
- a first PMOS transistor for delivering a first voltage for flowing the first current capability in the switching unit to the switching unit after receiving output of the first NAND gate at gate.

8. The semiconductor memory device as recited in claim 7, wherein the first sense amplifying connect control block further includes a first level shifter for outputting to gate of the first PMOS transistor after shifting a signal outputted from the first NAND gate to the first voltage level.

9. The semiconductor memory device as recited in claim 7, wherein the second sense amplifying connect control block includes:
- a forth NOR gate for receiving output of the third NOR gate at one terminal and a signal for selecting all the first and the second cell arrays included in both side of the sense amplifying unit at the other terminal; and
- a PMOS transistor for delivering a second voltage for flowing the second current capability in the switching unit to the switching unit after receiving output of the forth NOR gate at gate.

10. The semiconductor memory device as recited in claim 9, wherein the second sense amplifying connect control block further includes a second level shifter for outputting to gate of the second PMOS transistor after shifting a signal outputted from the forth NOR gate to the second voltage level.

11. The semiconductor memory device as recited in claim 7, wherein the sense amplifying disconnect control block includes:
- a third inverter for inversing and outputting the first disconnect signal;
- a second NAND gate for receiving a signal for selecting the second cell array included in the other side of the sense amplifying unit at one terminal and output of the third inverter at the other terminal; and
- a NMOS transistor for delivering a third voltage for turning the switching unit off after receiving output of the second NAND gate at gate to the switching unit.

12. The semiconductor memory device as recited in claim 1, wherein the switching unit includes at least one MOS transistor.

13. A method for executing a semiconductor memory device having a cell array including a plurality of unit cells, a sense amplifier for sensing and amplifying voltage level of a bit line connected to the plurality of the unit cells, and a switching transistor for connecting or disconnecting the sense amplifying unit to the bit line, comprising the steps of:
(a) connecting the cell array to the sense amplifier by turning the switching transistor off;
(b) supplying voltage level of a data signal stored in the unit cell of the cell array;
(c) disconnecting the bit line to the sense amplifier by turning the switching transistor off;
(d) sensing and amplifying voltage appearing on the bit line by the sense amplifier unit;
(e) E providing the a first current to the switching transistor by supplying a first voltage to gate of the switching transistor; and
(f) reconnecting the cell array to the sense amplifying unit by providing a second current throughout the switching transistor after supplying a second voltage being higher than the first voltage to gate of the switching transistor.

14. The method for executing a semiconductor memory device as recited in claim 13, further comprising, before the step (a), the step of providing the first current throughout the switching transistor by supplying the first voltage to gate of the switching transistor.

* * * * *